United States Patent
Honda et al.

(10) Patent No.: US 7,414,892 B2
(45) Date of Patent: Aug. 19, 2008

(54) NONVOLATILE SEMICONDUCTOR MEMORY DEVICE WHICH STORES MULTIVALUE DATA

(75) Inventors: Yasuhiko Honda, Tokyo (JP); Masao Kuriyama, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/763,690

(22) Filed: Jun. 15, 2007

(65) Prior Publication Data
US 2007/0236998 A1    Oct. 11, 2007

Related U.S. Application Data

(62) Division of application No. 11/401,286, filed on Apr. 11, 2006.

(30) Foreign Application Priority Data
Apr. 12, 2005   (JP)   ............... 2005-114750

(51) Int. Cl.
    *G11C 11/34*    (2006.01)
(52) U.S. Cl. .............. 365/185.22; 365/185.03; 365/185.2; 365/185.21; 365/189.07; 365/189.15; 365/189.09
(58) Field of Classification Search ............ 365/185.22, 365/185.03, 185.2, 185.21, 189.07, 189.15, 365/189.09
See application file for complete search history.

(56) References Cited

U.S. PATENT DOCUMENTS

| | | | | |
|---|---|---|---|---|
| 6,421,277 B2 * | 7/2002 | Tsunesada | ............... | 365/185.3 |
| 6,580,643 B1 * | 6/2003 | Satoh et al. | ............ | 365/185.22 |
| 6,639,837 B2 * | 10/2003 | Takano et al. | ............ | 365/185.2 |
| 6,714,459 B2 * | 3/2004 | Hirano | ............... | 365/185.3 |
| 6,807,097 B2 * | 10/2004 | Takano et al. | ............ | 365/185.03 |
| 6,807,101 B2 * | 10/2004 | Ooishi et al. | ............ | 365/185.21 |
| 6,816,413 B2 * | 11/2004 | Tanzawa | ............... | 365/185.2 |
| 6,882,567 B1 * | 4/2005 | Wong | ............... | 365/185.03 |
| 6,937,522 B2 | 8/2005 | Funaki | | |
| 7,031,193 B2 * | 4/2006 | Micheloni et al. | ...... | 365/185.22 |
| 7,054,193 B1 * | 5/2006 | Wong | ............... | 365/185.03 |
| 7,068,540 B2 * | 6/2006 | Micheloni et al. | ...... | 365/185.19 |
| 7,251,165 B2 * | 7/2007 | Taito et al. | ............ | 365/185.22 |

FOREIGN PATENT DOCUMENTS

JP    2001-325795    11/2001

OTHER PUBLICATIONS

B. Pathak, et al., "A 1.8V 64Mb 100MHz Flexible Read While Write Flash Memory", 2001 IEEE International Solid-State Circuits Conference, Session 2,, Non-Volatile Memories, 2.3, Feb. 5, 2001, 3 Pages.

* cited by examiner

*Primary Examiner*—Viet Q Nguyen
(74) *Attorney, Agent, or Firm*—Oblon, Spivak, McClelland, Maier & Neustadt, P.C.

(57) ABSTRACT

A reference current generating circuit generates at least one reference current. A voltage generating circuit generates voltage. A sense amplifier compares a current caused to flow in a memory cell according to the voltage supplied from the voltage generating circuit with the reference current supplied from the reference current generating circuit. A control section is supplied with an output signal of the sense amplifier. When verifying the threshold voltage of the memory cell, the control section causes the voltage generating circuit to generate verify voltage which is the same as readout voltage generated at the time of data readout from the memory cell.

6 Claims, 11 Drawing Sheets

NONVOLATILE SEMICONDUCTOR MEMORY DEVICE WHICH STORES MULTIVALUE DATA

CROSS-REFERENCE TO RELATED APPLICATIONS

This application is a divisional of and claims the benefit of priority under 35 USC §120 from U.S. Ser. No. 11/401,286, filed Apr. 11, 2006 and is based upon and claims the benefit of priority under 35 USC §119 from the Japanese Patent Application No. 2005-114750, filed Apr. 12, 2005, the entire contents of which are incorporated herein by reference.

BACKGROUND OF THE INVENTION

1. Field of the Invention

This invention relates to a nonvolatile semiconductor memory device which stores multivalue data, for example, and more particularly to a nonvolatile semiconductor memory device using a current comparison type sense amplifier.

2. Description of the Related Art

For example, various types of nonvolatile semiconductor memory devices (which are hereinafter referred to as flash memories) which are configured by EEROM cells and in which data can be electrically and simultaneously erased are developed. For example, the readout and verify operations of a NOR type flash memory are performed by comparing currents flowing in a selected memory cell and a reference memory cell by use of a sense amplifier (for example, refer to Jpn. Pat. Appln. KOKAI Publication No. 2001-325795, B. Pathak et al., A 1.8V 64 Mb 100 MHz Flexible Read While Write Flash Memory, 2001, IEEE international Solid-State Circuits Conference). This type is called a current comparison type sense system.

In the case of the current comparison type sense system, voltage applied to the control gate of a memory cell is changed at the verify time in which the threshold voltage of the memory cell having data written therein is verified and at the readout time in which data is read out from the memory cell. A system in which the threshold voltage is thus verified by use of voltage different from the voltage used at the readout time is hereinafter called a voltage verify system.

In a case where the verify operation is performed by use of the above voltage verify system when binary data of "0" or "1" is stored in the memory cell, a current margin (which is hereinafter referred to as a sense current margin) with respect to the reference current at the data readout time can be made sufficiently large even if the current-voltage characteristic (which is hereinafter referred to as Gm) of the memory cell varies.

However, when multivalue data such as "00", "01", "10", "11" is stored in the memory cell, for example, a sufficient large sense current margin cannot be attained because of a variation in Gm of the memory cell at the verify time according to the voltage verify system. Therefore, it becomes difficult to stably verify the threshold voltage of the memory cell and becomes impossible to control the threshold voltage of the memory cell with high precision. Accordingly, it is desired to develop a nonvolatile semiconductor memory device in which a sufficiently large current margin at the readout time can be attained and the threshold voltage of the memory cell can be controlled with high precision.

BRIEF SUMMARY OF THE INVENTION

According to a first aspect of this invention, there is provided a semiconductor memory device comprising memory cells; a reference current generating circuit which generates at least one reference current; a voltage generating circuit which generates voltage; a sense amplifier which compares a current caused to flow in the memory cell according to the voltage supplied from the voltage generating circuit with the reference current supplied from the reference current generating circuit; and a control section supplied with an output signal of the sense amplifier, the control section causing the voltage generating circuit to generate verify voltage which is the same as readout voltage generated at the time of data readout from the memory cell when the threshold voltage of the memory cell is verified.

According to a second aspect of this invention, there is provided a semiconductor memory device comprising memory cells; a reference current generating circuit which generates at least one reference current; a voltage generating circuit which generates one of data readout voltage and a plurality of verify voltages different from the readout voltage and supplies the thus generated voltage to a control gate of the memory cell; a sense amplifier which compares a current flowing in the memory cell with the reference current supplied from the reference current generating circuit; and a control section supplied with an output signal of the sense amplifier, the control section changing the reference current generated from the reference current generating circuit to perform a current verify operation when first threshold voltage lower than the readout voltage is set in the memory cell and changing the verify voltage generated from the voltage generating circuit to perform a voltage verify operation when one of second threshold voltage lower than the first threshold voltage and third threshold voltage higher than the readout voltage is set in the memory.

According to a third aspect of this invention, there is provided a semiconductor memory device comprising memory cells; a reference current generating circuit which generates at least one reference current; a voltage generating circuit which generates one of data readout voltage and a plurality of verify voltages different from the readout voltage and supplies the thus generated voltage to a control gate of the memory cell; a sense amplifier which compares a current flowing in the memory cell with the reference current supplied from the reference current generating circuit; and a control section supplied with an output signal of the sense amplifier, the control section changing the reference current generated from the reference current generating circuit, setting threshold voltage in the memory cell by performing a current verify operation, changing the plurality of verify voltages generated from the voltage generating circuit and detecting a memory cell in which the threshold voltage lying outside a specified range is set.

DETAILED DESCRIPTION OF THE INVENTION

There will now be described embodiments of this invention with reference to the accompanying drawings.

Figure 2:
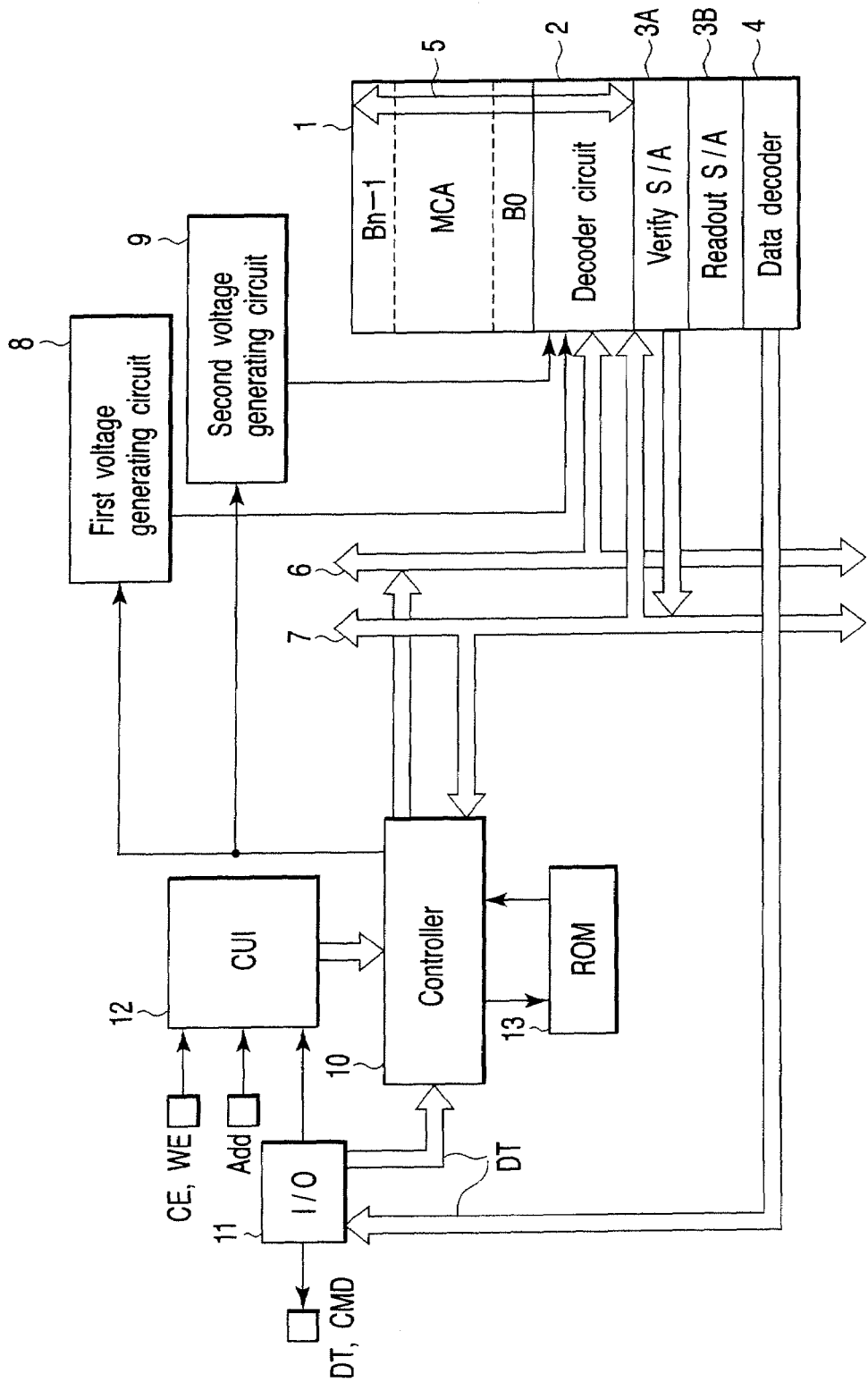
FIG. 2 is a schematic configuration diagram showing a flash memory which is applied to the first embodiment and stores multivalue data.

First, the schematic configuration of a flash memory which is applied to a first embodiment and stores multivalue data is explained with reference to FIGS. 2, 3 and 4. As shown in FIG. 2, a memory cell array (MCA) 1 has n blocks B0 to Bn−1. Each of the blocks B0 to Bn−1 is a minimum unit for data erase. The memory cell array 1 includes a decoder circuit 2 which selects a memory cell, verify sense amplifier (S/A) 3A, readout sense amplifier (S/A) 3B and data decoder 4. Further, a data line 5 is commonly arranged for the blocks B0 to Bn−1 of the memory cell array 1.

The decoder circuit 2 is connected to an address bus line 6 and selects a word line (row line) and bit line (column line) according to an address signal supplied from a controller 10 to select a memory cell.

An input ends of the verify sense amplifier 3A and readout sense amplifier 3B are connected to the data line 5. The verify sense amplifier 3A and readout sense amplifier 3B each have a reference current generating circuit using at least one reference cell to generate, for example, three reference currents as will be described later when 2-bit data of four values, for example, is stored in the memory cell. The sense amplifiers 3A, 3B each compare the reference current supplied from the reference current generating circuit with a current flowing through the selected memory cell.

An output end of the verify sense amplifier 3A is connected to a data bus line 7, and it detects a signal read out from the memory cell at the data write time or erase time and supplies the same to the controller 10. An output end of the readout sense amplifier 3B is connected to the data decoder 4. The data decoder 4 decodes a signal supplied from the readout sense amplifier 3B and generates an output signal. The output end of the data decoder 4 is connected to an input/output section (I/O) 11 and a signal output from the data decoder 4 at the data readout time is output to the exterior via the input/output section 11.

The address bus line 6 and data bus line 7 are connected to the controller 10. The controller 10 is connected to the input/output section 11, CUI (Command User Interface) 12, ROM 13 and first and second voltage generating circuits 8, 9. The input/output section 11 supplies a command CMD supplied from the exterior to the CUI 12 and supplies write data of the memory cell to the controller 10. Further, the input/output section 11 outputs readout data supplied from the readout sense amplifier 3B to the exterior.

Further, the CUI 12 receives signals such as a chip enable signal CE and write enable signal WE input from the exterior and an address signal Add, processes the above signals and supplies the thus processed signals to the controller 10. In the ROM 13, various programs used to control the operation of the controller 10 are stored. The controller 10 controls the whole operation of the flash memory according to the command CMD and programs. That is, it supplies the address signal to the address bus line 6 and supplies write data to the data bus line 7. Further, the controller 10 controls the first and second voltage generating circuits 8, 9 at the data write time, verify time, readout time and erase time to generate preset voltages. The first voltage generating circuit 8 generates voltage applied to the control gate of the memory cell, that is, word line voltage at the data write time, verify time and readout time. The word line voltage is supplied to a word line via a row main decoder and row pre-decoder which will be described later in the decoder circuit 2. Further, the second voltage generating circuit 9 generates a drain voltage supplied to a drain of the memory cell at the data write time. The drain voltage is supplied to the drain of the memory cell via a column pre-decoder and column gate of the decoder circuit 2.

Figure 3:
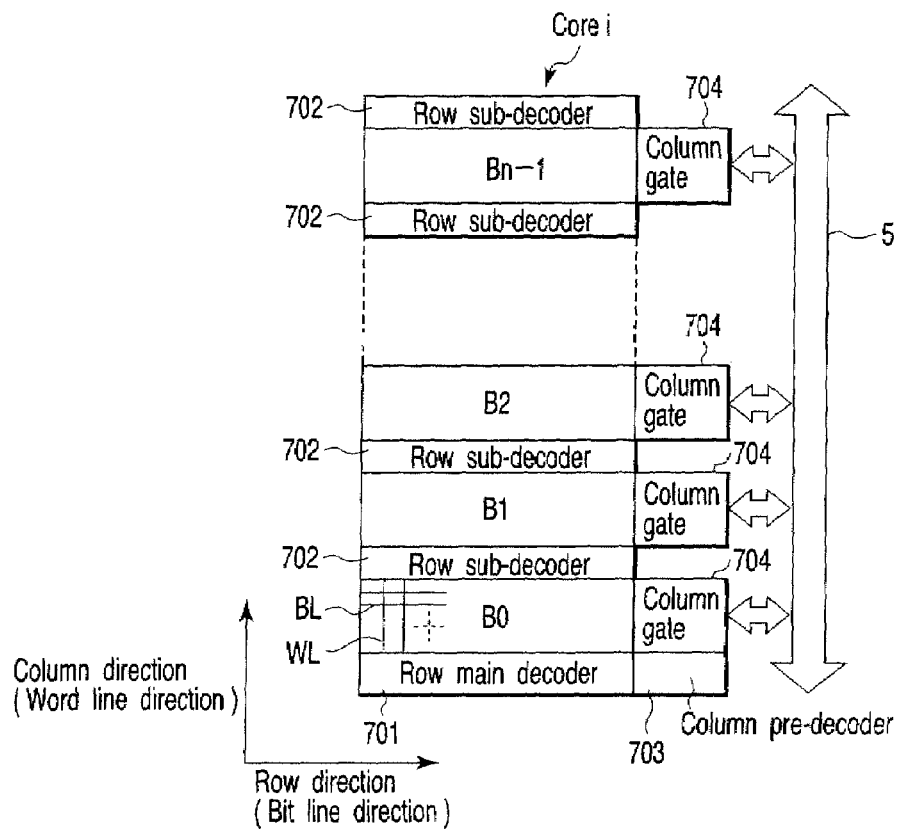
FIG. 3 is a configuration diagram showing a memory cell array shown in FIG. 2.

FIG. 3 shows the configuration of the memory cell array 1. A row main decoder 701 which selects one of word lines WL is arranged at the end portion of an array of the blocks B0 to Bn−1 and row sub decoders 702 which select blocks are arranged between respective blocks. A column decoder is arranged at the end portion of the bit lines BL of the blocks B0 to Bn−1 and is configured by a column pre-decoder 703 and column gates 704 which select the bit lines BL. The column gates 704 are connected to the data line 5. The row main decoder 701 and column pre-decoder 703 are arranged in the decoder circuit 2 shown in FIG. 2.

Figure 4:
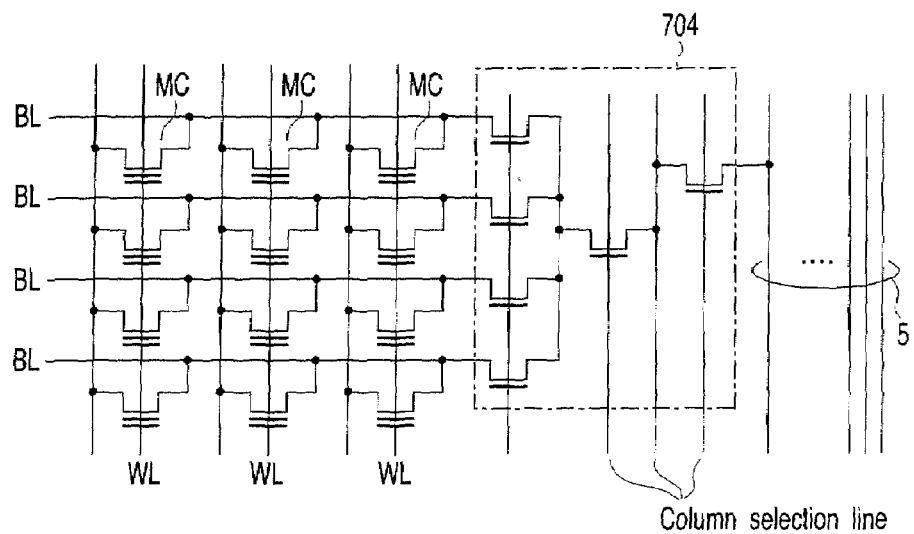
FIG. 4 is a circuit diagram showing each block configuration shown in FIG. 2.

FIG. 4 shows the configuration of each of the blocks B0 to Bn−1. As shown in FIG. 4, the flash memory is a NOR type flash memory, for example, a plurality of bit lines BL and a plurality of word lines WL are arranged to intersect each other and memory cells MC are arranged on the intersecting portions of the bit lines BL and the word lines WL. For example, the memory cell MC is configured by an EEPROM cell. A drains of the memory cells MC arranged on each column is connected to a corresponding one of the bit lines BL, a control gates of the memory cells MC arranged on each row is connected to a corresponding one of the word lines WL, and the sources thereof are connected to a common source line.

First Embodiment

Figure 1A:
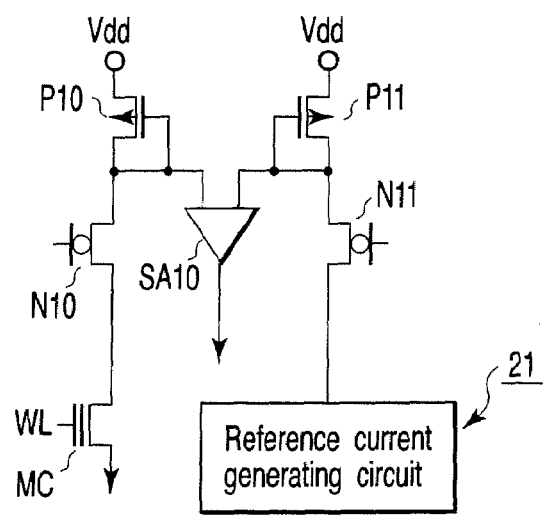
FIG. 1A is a circuit diagram showing one example of a sense amplifier applied to a current comparison type sense system according to a first embodiment of this invention.

FIG. 1A shows an example of the sense amplifier applied to a current comparison type sense system according to the first embodiment. The sense amplifier is commonly used for the verify sense amplifier 3A and readout sense amplifier 3B, but threshold voltages set in a reference memory cell to be described later are different.

In FIG. 1A, one of input ends of a sense amplifier SA10 is connected to a selected memory cell MC via an N-channel MOS transistor (which is hereinafter referred to as an NMOS) N10 and connected to a node supplied with power supply voltage Vdd via a P-channel MOS transistor (which is hereinafter referred to as a PMOS) P10 functioning as a load. Further, the input end of the sense amplifier SA10 is connected to one end of an NMOS N11 and connected to a node supplied with power supply voltage Vdd via a P-channel MOS transistor (which is hereinafter referred to as a PMOS) P11 functioning as a load. The other end of the NMOS N11 is connected to a reference current generating circuit 21. The NMOSs N10, N11 are transistors whose threshold voltages are set at 0V.

Figure 1B:
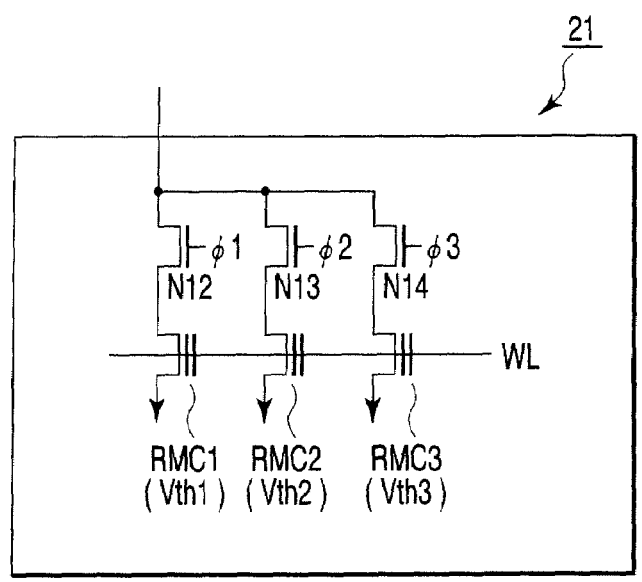
FIG. 1B is a circuit diagram showing one example of a reference current generating circuit shown in FIG. 1A.

FIG. 1B shows an example of the reference current generating circuit 21. For example, the reference current generating circuit 21 includes NMOSs N12, N13, N14 and reference memory cells RMC1, RMC2, RMC3. One-side ends of the NMOSs N12, N13, N14 are connected to the other end of the NMOS N11. The other ends of the NMOSs N12, N13, N14 are respectively connected to the reference memory cells RMC1, RMC2, RMC3. The reference memory cells RMC1, RMC2, RMC3 are each an EEPROM with the same configuration as the memory cell and different threshold voltages Vth1, Vth2, Vth3 are set in the respective reference memory cells, for example.

The configuration of the reference current generating circuit 21 is not limited to that shown in FIG. 1B, and when the circuit is used for a current verify operation which will be described later, the number of NMOSs N12, N13, N14 and the number of reference memory cells RMC1, RMC2, RMC3 can be increased according to the number of required verify currents.

When the sense amplifier with the above configuration is applied to the verify sense amplifier 3A, the same voltage is applied to the control gates of the selected memory cell and the reference memory cells RMC1 to RMC3 via the word lines WL. In this state, signals $\phi1$, $\phi2$, $\phi3$ are selectively set to a high level according to threshold voltage to be verified and a verify current as a reference current is output by one of the reference memory cells RMC1, RMC2, RMC3 selected by the NMOSs N12, N13, N14. The verify current and a current flowing in the selected memory cell are compared with each other by the sense amplifier SA10. An output signal of the sense amplifier SA10 is supplied to the controller 10. The controller 10 controls the write operation for the memory cell according to the signal supplied from the sense amplifier SA10.

When the sense amplifier SA10 with the above configuration is applied to the readout sense amplifier 3B, the same voltage is applied to the control gates of the selected memory cell and the reference memory cells RMC1 to RMC3 via the word lines WL at the data readout time. In this state, first, the NMOS N13 is made conductive according to the signal $\phi2$, for example. In this state, a current flowing in the reference memory cell RMC2 and a current flowing in the memory cell MC are detected by the sense amplifier SA10. After this, the NMOS N12 is made conductive according to the signal $\phi1$ when a signal output from the sense amplifier SA10 is "0", and the NMOS N14 is made conductive according to the signal $\phi3$ when the output signal is "1". Thus, the current flowing in the reference memory cell RMC1 or RMC3 and the current flowing in the memory cell MC are detected by the sense amplifier SA10. Two-bit data is generated based on an output signal from the sense amplifier SA10 according to the signal $\phi2$ and an output signal from the sense amplifier SA10 according to the signal $\phi1$ or $\phi3$.

In the verify operation at the data write time, the same potential as that used at the readout time is supplied to the word lines of the selected memory cell MC and the reference memory cells. Further, the signals $\phi1$, $\phi2$, $\phi3$ are selected according to write data. In this state, a current flowing in the memory cell MC and a current flowing in the selected reference memory cell are detected and verified by the sense amplifier SA10. Thus, a margin can be attained by comparing the current flowing in the memory cell in correspondence to each write data with the reference current flowing in the reference memory cell RMC.

As shown in FIG. 1A, the current comparison type sense system amplifies and compares a current flowing in the memory cell at the data readout time and a reference current flowing in the reference memory cell by use of the PMOSs P10, P11 functioning as a load connected to the sense amplifier SA10.

Figure 5:
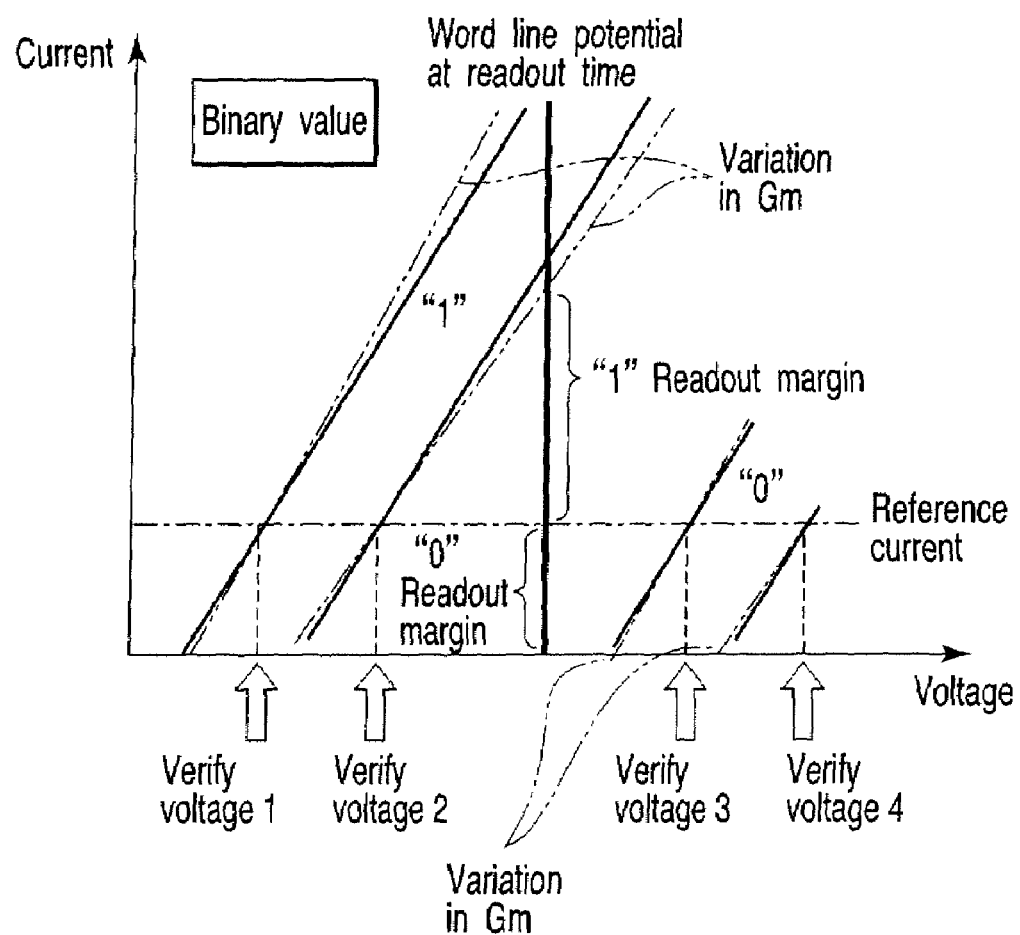
FIG. 5 is a diagram showing a 2-valued voltage verify system.
Figure 6:
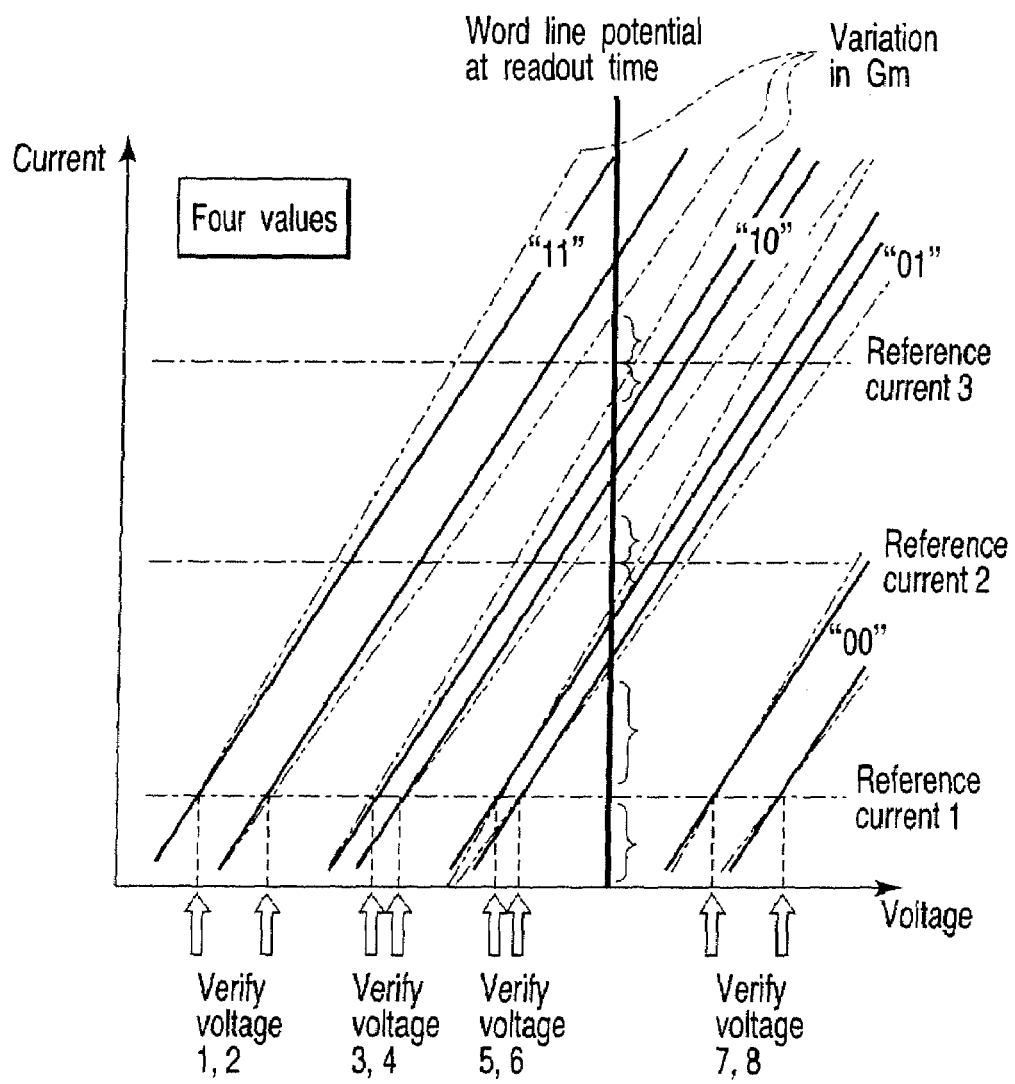
FIG. 6 is a diagram showing a 4-valued voltage verify system.

FIG. 5 shows a 2-valued voltage verify system and FIG. 6 shows a 4-valued voltage verify system. The voltage verify system sets word line potential at the verify time to potential different from the word line potential at the readout time. In the case of binary (2-valued) data shown in FIG. 5, the word line potential at the verify time is changed to verify voltage 1 to verify voltage 4. Further, in the case of 4-valued data shown in FIG. 6, the word line potential at the verify time is changed to verify voltage 1 to verify voltage 8.

Thus, when the word line potentials at the verify time and readout time are set different from each other, a current of the memory cell corresponding to the word line potential at the verify time can be ensured as shown in FIGS. 5, 6. However, a current of the memory cell corresponding to the word line potential at the readout time cannot be ensured because of a variation in Gm of the memory cell (central values are indicated by solid lines and an upper limit value and lower limit value are indicated by broken lines). As shown in FIG. 5, in the case of binary data, a current margin used to determine whether the current is "1" or "0" with respect to the reference current is set sufficiently large even if Gm of the memory cell varies as indicated by the broken likes.

However, as shown in FIG. 6, in the case of 4-valued data, a current margin used to determine whether the lower bit is "0" or "1" with respect to the reference current 2 and a current margin used to determine whether the upper bit is "0" or "1" with respect to the reference current 3 are set smaller in comparison with the current margin with respect to the reference current 1. Therefore, in the case of multiple values other than four values, it is difficult to use the above voltage verify system.

Therefore, in the first embodiment, the word line potential at the verify time is set equal to the word line potential at the readout time and a current flowing in the memory cell and a current flowing in the reference memory cell are detected by use of the sense amplifier.

Figure 7:
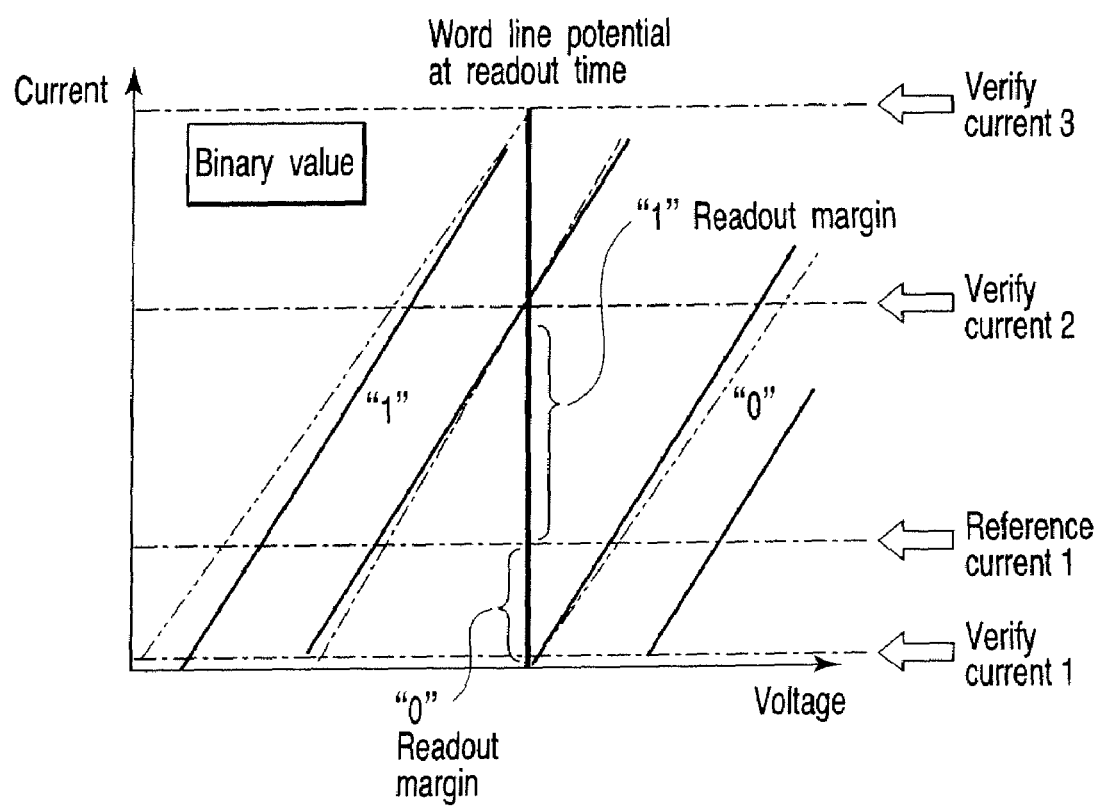
FIG. 7 is a diagram showing a binary data verify system in the first embodiment.
Figure 8:
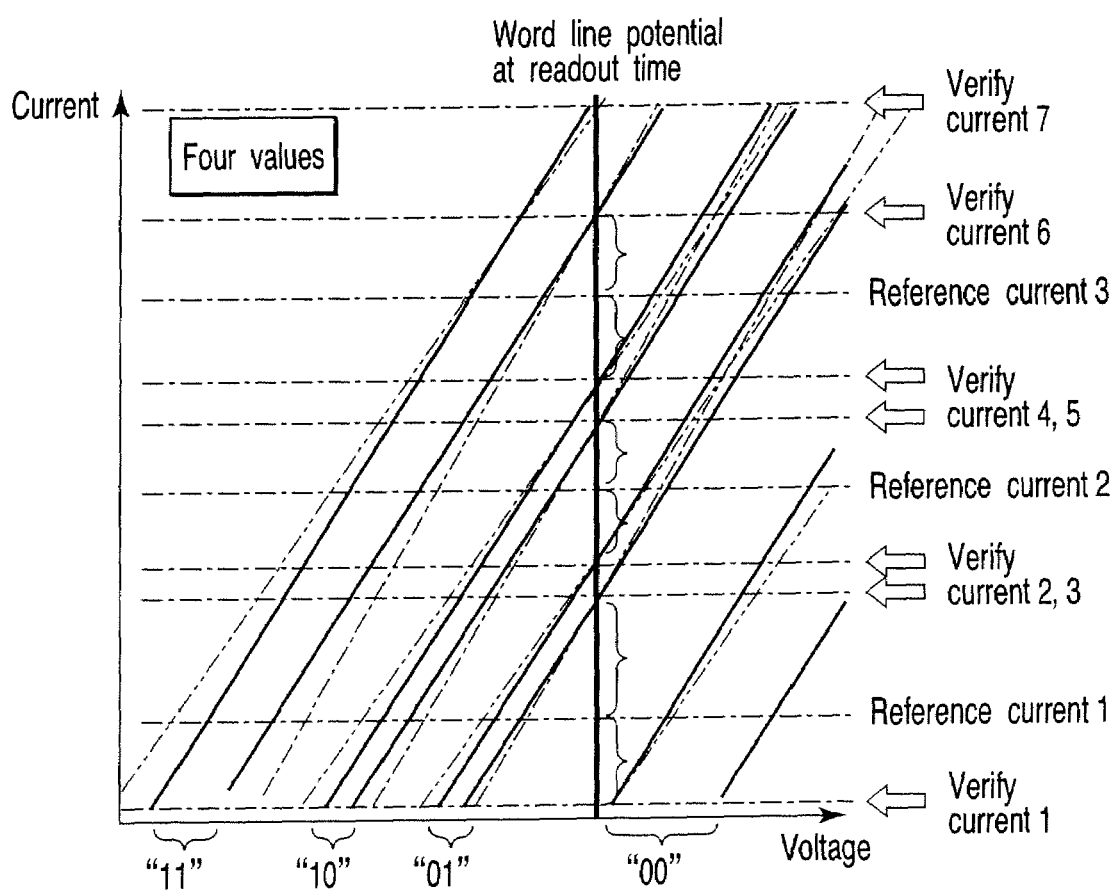
FIG. 8 is a diagram showing a 4-valued data verify system in the first embodiment.

FIG. 7 shows a binary data verify system in the first embodiment and FIG. 8 shows a 4-valued data verify system in the first embodiment.

The word line potential of the memory cell at the verify time is set equal to that at the readout time and the reference current is changed to a desired current value. Then, a verify current corresponding to the threshold voltage (data) of the memory cell with respect to each reference current becomes larger in comparison with the conventional case. Therefore, a sufficiently large margin for the sense current can be attained according to each threshold voltage of the memory cell.

According to the first embodiment, the threshold voltage of the memory cell is verified by setting the word line potential at the verify time equal to the word line potential at the readout time and comparing the current flowing in the memory cell with the reference current flowing in the reference memory cell. In the case of the current verify operation, a variation in the threshold voltage set in the memory cell becomes large, but the current margin corresponding to each data can be set large at the readout time. Therefore, a stable readout operation can be performed.

Second Embodiment

As described above, in the case of the first embodiment, since a variation in the threshold voltage becomes large, a sufficiently large margin of the threshold voltage cannot be attained. For example, even when the memory cell is set into the "0" or "00" state according to write data, there occurs a possibility that it becomes difficult to correctly read out data if an amount of electrons written into the memory cell is reduced even slightly because of deterioration with time.

Further, in the case of a NOR type flash memory, a plurality of memory cells are connected in parallel to the same bit line. Therefore, when data of "1" or "11" is set in the memory cell, it is necessary to set the memory cell into the OFF state if the memory cell is non-selected. However, if a current amount flowing in the memory cell set in the OFF state becomes large, there occurs a possibility that data cannot be correctly read out.

Therefore, in the second embodiment, the voltage verify operation and the current verify operation are variously combined and used for respective applications to separately and stably attain the satisfactory sense current margin and threshold voltage margin.

Figure 9:
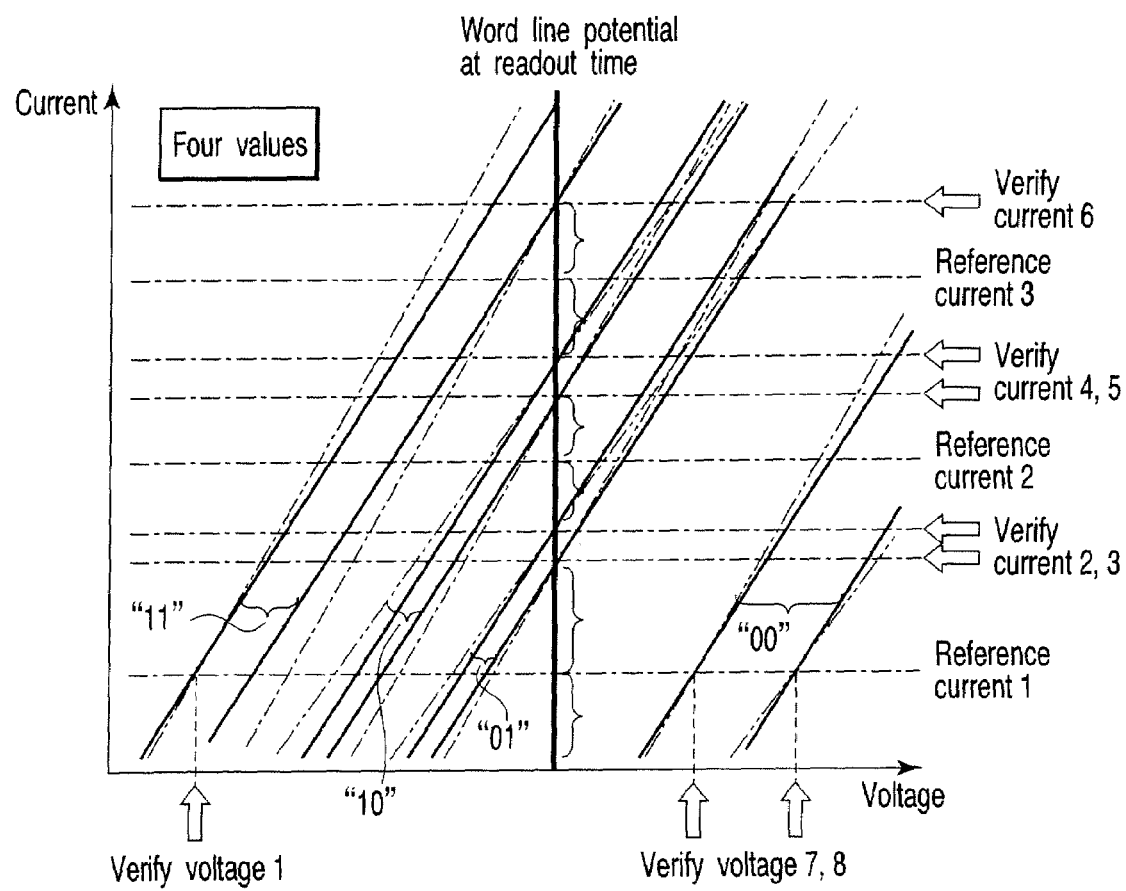
FIG. 9 is a diagram for illustrating the operation of a second embodiment.

FIG. 9 shows the operation of the second embodiment. A current verify operation is used for the verify operation in which a precise sense current margin is required and a voltage verify operation is used for the verify operation in which a precise sense threshold voltage margin is required.

That is, when a current verify system as shown in FIG. 8 is used to verify the highest threshold voltage of data "00", a potential difference between the word line potential at the readout time and the threshold voltage becomes extremely small. Therefore, when the threshold voltage varies due to deterioration with time, there occurs a possibility that readout data will vary. Therefore, it is necessary to set the lower limit and upper limit of the threshold voltage with respect to data "00" sufficiently higher than the word line potential obtained at the readout time. Thus, since the current verify system is not adequately used for the verify operation of data "00", the voltage verify system is used to precisely control the threshold voltage.

Further, the voltage verify system is used for the lower limit of the threshold voltage for the data "11". That is, when the current verify system is applied for the verify operation of data "11", there occurs a possibility that the memory cell comes to have a small threshold value, and therefore, the memory cell is not sufficiently turned OFF at the non-selected time in some cases. Thus, the current verify system is not adequately applied to verify values on the lower-limit side of data "11" and the voltage verify system is used.

The current verify system and voltage verify system are switched according to write data by the controller 10. The controller 10 performs the voltage verify operation to verify values on the lower-limit side of data "11" after data erase and performs the current verify operation to verify values on the upper-limit side thereof.

Figure 10:
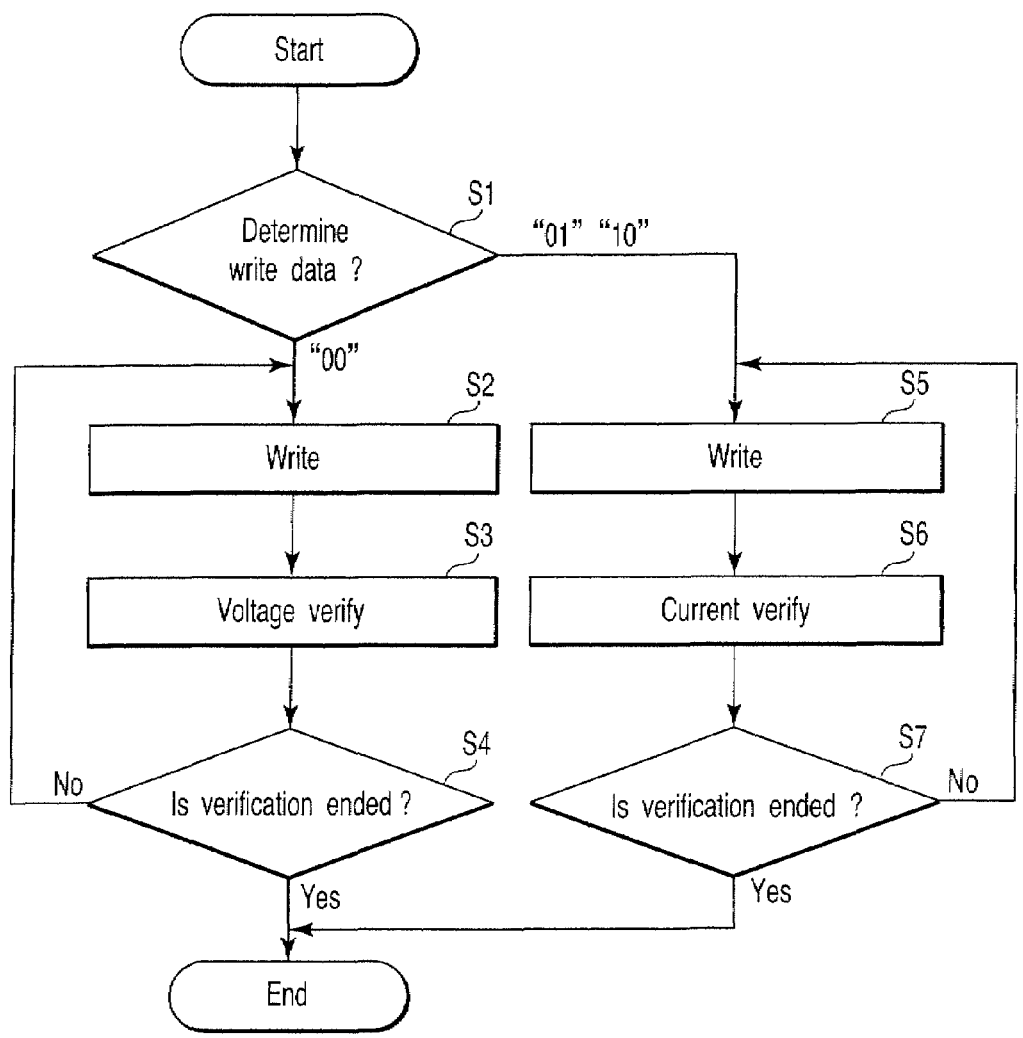
FIG. 10 is a flowchart for illustrating the operation in the second embodiment.

FIG. 10 shows the operation of the controller 10 at the data write time. The controller 10 determines write data (S1) and performs the voltage verify operation after the data write operation if the write data is "00" (S2, S3). Further, if the write data is "01" or "10", it performs the current verify operation after writing data (S5, S6). In the case of the voltage verify operation (S3), the controller 10 controls and causes the reference current generating circuit 21 to generate a reference current corresponding to the write data. Further, the controller 10 controls the first voltage generating circuit 8 to change the voltage of the word line. In this state, the voltage verify operation is performed and whether the verify operation is terminated or not is determined (S4). As a result, if a written data amount is insufficient, data is written again and the voltage verify operation is performed.

In the case of the current verify operation (S6), the controller 10 controls the first voltage generating circuit 8 to set the voltage of the word line to the same voltage as the readout voltage. Further, the controller 10 controls and causes the reference voltage generating circuit 21 to generate a reference current corresponding to the write data. In this state, the current verify operation is performed and whether the verify operation is terminated or not is determined (S7). As a result, if a written data amount is insufficient, data is written again and the current verify operation is performed. By repeatedly performing the above operation, the threshold voltage of the memory cell is set.

According to the second embodiment, at the readout time, the current verify operation is performed for write verification of data which requires a sufficient sense current margin and the voltage verify operation is performed for write verification of data which requires precise control of the threshold voltage. Therefore, at the data readout time, occurrence of data readout errors can be prevented and a current margin which is sufficiently large and necessary for readout can be attained.

Third Embodiment

As described above, a variation in Gm of the memory cell has a large influence on the sense current margin and threshold voltage margin. Therefore, in a third embodiment, a method for easily detecting an abnormal memory cell having Gm which exceeds a specified value is explained.

Figure 11:
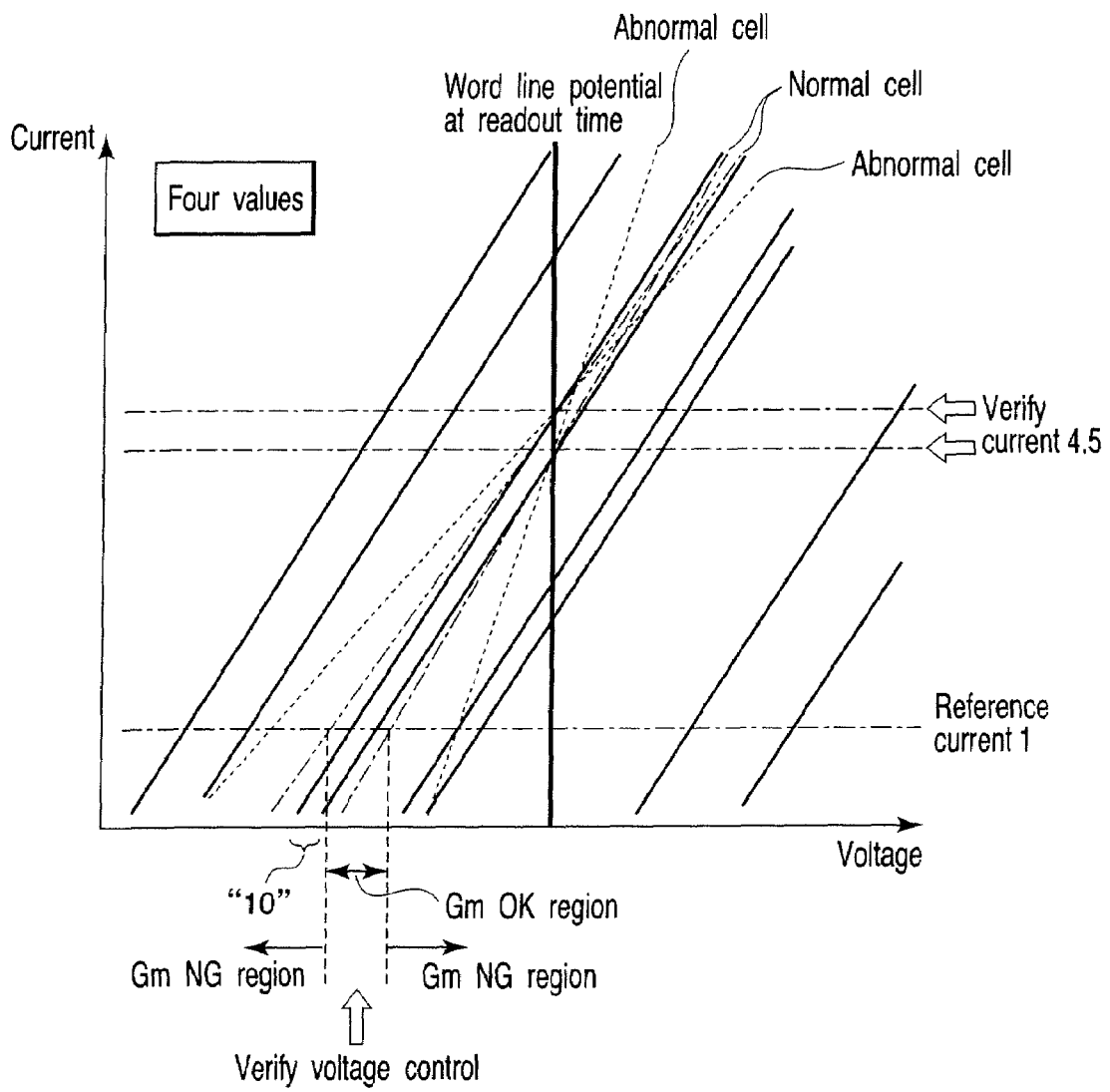
FIG. 11 is a diagram for illustrating the operation of a third embodiment.

As shown in FIG. 11, first, the threshold voltage of a memory cell is adjusted to 4-valued data "10" by performing the current verify operation, for example. Then, the threshold voltage distribution of the memory cell is measured by performing the voltage verify operation. The threshold voltage distribution of Gm corresponding to data "10" can be predicted. Therefore, a memory cell having threshold voltage other than the predicted specified value can be easily detected as an abnormal memory cell.

Figure 12:
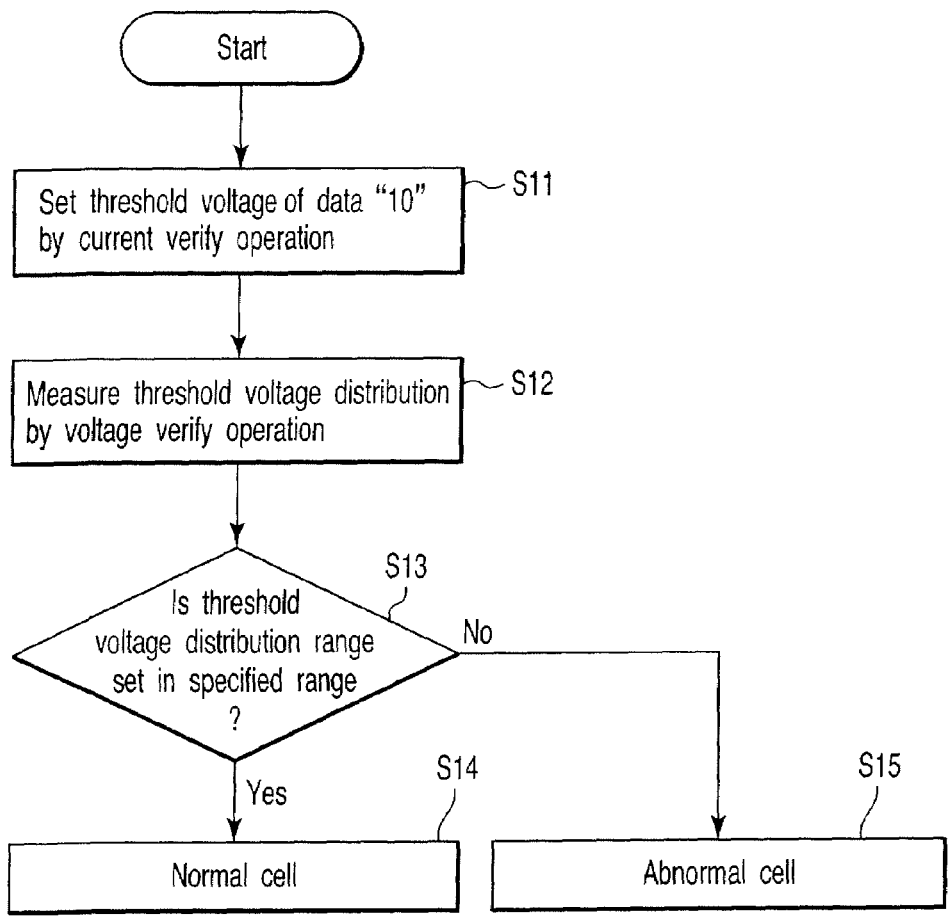
FIG. 12 is a flowchart for illustrating the operation in the third embodiment.

FIG. 12 illustrates the operation of a controller 10. When detecting an abnormal memory cell, the controller 10 first sets data "10" in a memory cell selected by the current verify operation, for example (S11). That is, after data is written into the selected memory cell, the potential of a word line is set to potential set at the readout time by use of a first voltage generating circuit 8. Further, the controller 10 causes a reference current generating circuit 21 to generate a reference current for verification corresponding to data "10".

Thus, after the threshold voltage corresponding to data "10" is set in the memory cell, the threshold voltage set in the memory cell is measured by performing the voltage verify operation (S12). That is, the controller 10 causes the reference current generating circuit 21 to generate a reference current corresponding to data "10" obtained at the readout time. In parallel with this, the controller 10 causes the first voltage generating circuit 8 to generate verify voltage corresponding to data "10". That is, for example, voltage corresponding to the lower limit of the threshold voltage of data "10" is first generated. In this state, a current flowing in the memory cell is compared with the reference current by a sense amplifier SA10. Next, voltage corresponding to the upper limit of the threshold voltage of data "10" is generated. In this state, a current flowing in the memory cell is compared with the reference current by the sense amplifier SA10. Thus, the threshold voltage set in the memory cell is measured by performing the voltage verify operation.

After this, the measured threshold voltage is compared with a specified value of the threshold voltage distribution of data "10" previously measured (S13). As a result, if the threshold voltage lies within a range of the specified value, the memory cell is determined to be a correct memory cell (S14) and if the threshold voltage lies outside the range of the specified value, the memory cell is determined to be an abnormal memory cell (S15).

According to the third embodiment, a memory cell having abnormal Gm can be detected by performing the current verify operation and voltage verify operation. Thus, abnormal memory cells can be previously subjected to screening. Further, the manufacturing yield of memory cells can be enhanced by replacing the abnormal memory cell by a redundant memory cell (not shown).

In the above embodiments, the flash memory which stores multivalue data is explained, but this invention can be applied to a flash memory which stores binary data.

Further, the configuration of the reference current generating circuit 21 is not limited to that shown in FIGS. 1A, 1B. However, the reference current generating circuit can be configured by one reference memory cell and a plurality of current mirror circuits having different mirror ratios so that a current flowing in the reference memory cell may be supplied to the current mirror circuits and a plurality of reference currents will be output from the current mirror circuits.

Figure 13:
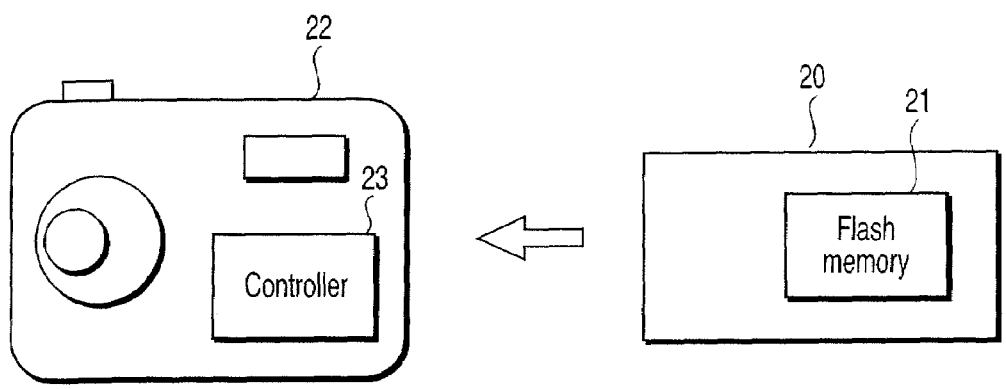
FIG. 13 is a view showing an example of an application to which each embodiment is applied.

FIG. 13 show an example of an application in which the above embodiments are applied. FIG. 13 shows a memory card 20 which is attached with a flash memory 21. The memory card 20 is connected to, for example, a digital still camera 22. The digital still camera 22 has a controller 23 as a host system. The flash memory 21 operates in accordance with a command and an address signal output from the controller 23. A device on the host side is not limited to a digital still camera, and various devices such as mobile phones, readers/writers of memory cards or the like can be applied thereto. Further, The memory card may includes controller. In the case, the controller in the memory card 20 functions as the host system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
memory cells;
a reference current generating circuit which generates at least one reference current;
a voltage generating circuit which generates one of data readout voltage and a plurality of verify voltages different from the readout voltage and supplies the thus generated voltage to a control gate of the memory cell;
a sense amplifier which compares a current flowing in the memory cell with the reference current supplied from the reference current generating circuit; and
a control section supplied with an output signal of the sense amplifier,
wherein the control section changes the reference current generated from the reference current generating circuit, sets threshold voltage in the memory cell by performing a current verify operation, changes the plurality of verify voltages generated from the voltage generating circuit and detects a memory cell in which the threshold voltage lying outside a specified range is set.

2. The device according to claim 1, wherein the control section causes the voltage generating circuit to generate the readout voltage when the current verify operation is performed and causes the reference current generating circuit to generate one of the plurality of reference currents when the voltage verify operation is performed.

3. The device according to claim 2, wherein the reference current generating circuit includes a plurality of reference memory cells in which different threshold voltages are set, and a selection circuit which selects one of the plurality of reference memories.

4. The device according to claim 1, wherein the memory cells configure a NOR type memory cell array.

5. The device according to claim 4, wherein the memory cell stores at least binary data.

6. A memory card including the semiconductor memory device according to claim 1.

* * * * *